(12) United States Patent
Chawla et al.

(10) Patent No.: US 6,750,711 B2
(45) Date of Patent: Jun. 15, 2004

(54) RF POWER AMPLIFIER STABILITY

(75) Inventors: Yogendra K. Chawla, Pittsford, NY (US); Aaron Radomski, Wyoming, NY (US); Craig A. Covert, Rochester, NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 09/835,249

(22) Filed: Apr. 13, 2001

(65) Prior Publication Data

US 2002/0149425 A1 Oct. 17, 2002

(51) Int. Cl.[7] .............................................. H03F 3/217
(52) U.S. Cl. ................................... 330/251; 330/207 A
(58) Field of Search .............................. 330/10, 207 A, 330/251

(56) References Cited

U.S. PATENT DOCUMENTS

| | | | |
|---|---|---|---|
| 3,919,656 A | 11/1975 | Sokal et al. .................. 330/51 |
| 4,717,884 A | * 1/1988 | Mitzlaff ....................... 330/251 |
| 5,146,178 A | * 9/1992 | Nojima et al. ............... 330/251 |
| 5,187,457 A | 2/1993 | Chawla et al. ........... 315/111.21 |
| 5,187,580 A | 2/1993 | Porter, Jr. et al. ...... 315/111.51 |
| 5,276,406 A | * 1/1994 | Samay et al. ................. 330/277 |
| 5,747,935 A | 5/1998 | Porter et al. ............ 330/207 A |
| 5,748,042 A | * 5/1998 | Norris et al. ................ 330/277 |
| 5,818,880 A | * 10/1998 | Kriz et al. ................... 330/251 |
| 5,939,941 A | * 8/1999 | Nair et al. ................... 330/251 |
| 6,020,636 A | 2/2000 | Adishian ..................... 257/728 |
| 6,046,546 A | 4/2000 | Porter et al. ................. 333/170 |
| 6,046,641 A | * 4/2000 | Chawla et al. .............. 330/276 |
| 6,157,258 A | * 12/2000 | Adishian et al. ............. 330/276 |
| 6,300,830 B1 | * 10/2001 | Pehlke ........................ 330/251 |

* cited by examiner

*Primary Examiner*—Khanh Van Nguyen
(74) *Attorney, Agent, or Firm*—Harness, Dickey & Pierce P.L.C.

(57) ABSTRACT

A high efficiency stable RF power amplifier with frequency tuning capability is disclosed. The present invention includes a novel circuit configuration which allows the drain or collector terminal of the power transistor to be at ground potential eliminating the need for an electrical insulator between the transistor and the heatsink. In an alternative embodiment, the source or emitter terminal of the power transistor is allowed to be at ground potential. In either case, the amplifier is operated in a switched mode to provide high efficiency amplification at a predetermined frequency band. Additionally, despite the switched mode operation, the amplifier is stable because properly controlled impedances are provided for baseband, sub-harmonic and harmonic frequencies.

52 Claims, 11 Drawing Sheets

RF POWER AMPLIFIER STABILITY

FIELD OF THE INVENTION

The present invention relates to high voltage transistors and, more particularly, to radio frequency ("RF") power amplifiers.

BACKGROUND OF THE INVENTION

High power radio frequency ("RF") power amplifiers are typically employed in semiconductor plasma processing applications. They can also be used in other RF applications, such as radio communications and induction and dielectric heating.

In a typical RF amplifier arrangement, a high power RF source produces an RF wave at a preset frequency which is furnished along a power conduit to a plasma chamber. The RF power is typically provided at a fixed impedance, typically 50 ohms. An RF drive signal is generated and fed to a power amplifier, which provides the RF wave at a desired power level, e.g., 1.25 kW, 2.5 kW, 5 kW, 10 kW, etc. Depending on the application, the RF wave can be provided at different preset frequencies, e.g., 13.56 MHz, 2.0 MHz, 4.0 MHz, 27.12 MHz, or 40.68 MHz. The bandwidth around these preset frequencies is plus or minus 5% to 10% for frequency agile plasma applications.

Conventional plasma generator RF power amplifiers use bipolar or field effect transistors with operating voltages between 40 and 50 volts. These semiconductor devices have semiconductor breakdown voltages in the range of 100 to 150 volts. For example, a 2.5 kW amplifier typically employs eight push-pull pairs of transistors in corporate parallel, with one transistor for each of the forward phase and reverse phase sections of each push-pull pair.

The output of the amplifier is typically classified into a commonly recognized class depending on the conduction characteristics of the amplifier's active devices. Classification is usually based on the amount of time the active devices operate during one cycle of input voltage. One of the most common classes of amplifier is the class C amplifier. Class C amplifiers are non-linear amplifiers capable of approximately 65% collector or drain efficiency.

Class E amplifiers are another class of amplifiers with switched mode operation capabilities, requiring no RF feedback. High efficiency amplification is achieved by a switching amplifier which, ideally, dissipates no power in the switch. All of the power is, instead, ideally dissipated in the load. An ideal class E amplifier dissipates no power because there is no voltage across the switching device when it is on and no current flowing through when it is off. By operating the transistor as a switch, the instantaneous power loss in the switch is almost zero.

Therefore, the switched amplifier classes, such as class E amplifiers, exhibit highest efficiency. For RF purposes, the switched type amplifiers exhibit high DC to RF efficiency and are suitable for many frequency agile applications. However, switched type amplifiers oftentimes exhibit instability due to the lack of a broadband RF feedback in the power amplifier configuration when operated into high VSWR loads.

Sophisticated cooling techniques are being developed to reduce high junction temperatures in high power RF generators. These sophisticated cooling techniques can include techniques such as heat spreaders or diamond inserts between the silicon die and the heatsink. These approaches aid in removing the heat at the die junctions at significant cost but do not address the cause of the high dissipation itself.

A further approach to alleviate the problem of high die junction temperatures is to use a high efficiency mode of operation with the amplifier such as class E or class F. However, the devices which are used as switches within the RF amplifier (such as bipolar transistors and MOSFETs) require an electrical insulator between the collector (for a bipolar transistor) or drain (for a MOSFET transistor) and the heatsink for improving the die junction temperatures. An added disadvantage is that the heat generated by the transistor is not easily removed. In addition, traditional class E amplifier efficiency degrades rapidly as the load impedance or operating frequency is varied. Therefore, the amplifier's operating range is limited or large amounts of silicon real estate is necessary to achieve satisfactory operation in environments such as plasma processing.

Therefore, there is a need for a more cost advantageous and reliable implementation of an RF amplifier which operates satisfactorily at very high power density and at high load mismatches. Additionally, there is a need for a switched amplifier which provides for stable performance without compromising output power efficiency.

SUMMARY OF THE INVENTION

In accordance with the present invention, a high efficiency RF amplifier with low die temperature for driving high load mismatches and high power density is disclosed. In one aspect, the present invention concerns a radio frequency ("RF") power amplifier with high output efficiency operating in a switched mode at a predetermined frequency band, said amplifier comprising:

a semiconductor device having a control terminal and two conducting terminals, said semiconductor device capable of a conductive state and a nonconductive state, wherein said control terminal controls the conductance across said two conducting terminals, wherein a first of said two conducting terminals is tied to ground potential, wherein a second of said two conducting terminals comprises the output of said amplifier;

a RF source coupled to said control terminal of said semiconductor device;

a resonant inductor circuit coupled to said second of said two conducting terminals, said resonant inductor circuit for eliminating the capacitance between said two conducting terminals when said semiconductor device is in said nonconductive state; and a filter coupled to said second of said two conducting terminals for providing controlled impedance to signals outside of said predetermined frequency band.

In another aspect, this invention concerns a radio frequency ("RF") power amplifier with high output efficiency operating in a switched mode at a predetermined frequency band, said amplifier comprising:

a discrete transistor having a gate terminal, a source terminal, and a drain terminal, said drain terminal in a grounded configuration, said source terminal comprising the output of said amplifier;

a RF source coupled to said gate terminal of said discrete transistor;

a resonant inductor circuit coupled to said source terminal for eliminating the capacitance between said drain terminal and said source terminal when said discrete transistor is in an off state; and a filter coupled to said source terminal for filtering out signals outside of said predetermined frequency band.

In another aspect, this invention concerns a radio frequency ("RF") power amplifier with high output efficiency operating in a switched mode at a predetermined frequency band, said amplifier comprising:

a discrete transistor having a gate terminal, a source terminal, and a drain terminal, said source terminal in a grounded configuration, said drain terminal comprising the output of said amplifier;

a RF source coupled to said gate terminal of said discrete transistor;

a resonant inductor circuit coupled to said drain terminal for eliminating the capacitance between said drain terminal and said source terminal when said discrete transistor is in an off state; and a filter coupled to said drain terminal for filtering out signals outside of said predetermined frequency band.

BRIEF DESCRIPTION OF THE DRAWINGS

A more complete understanding of the present invention may be obtained by considering the following description in conjunction with the drawings in which.

DETAILED DESCRIPTION

Figure 1:
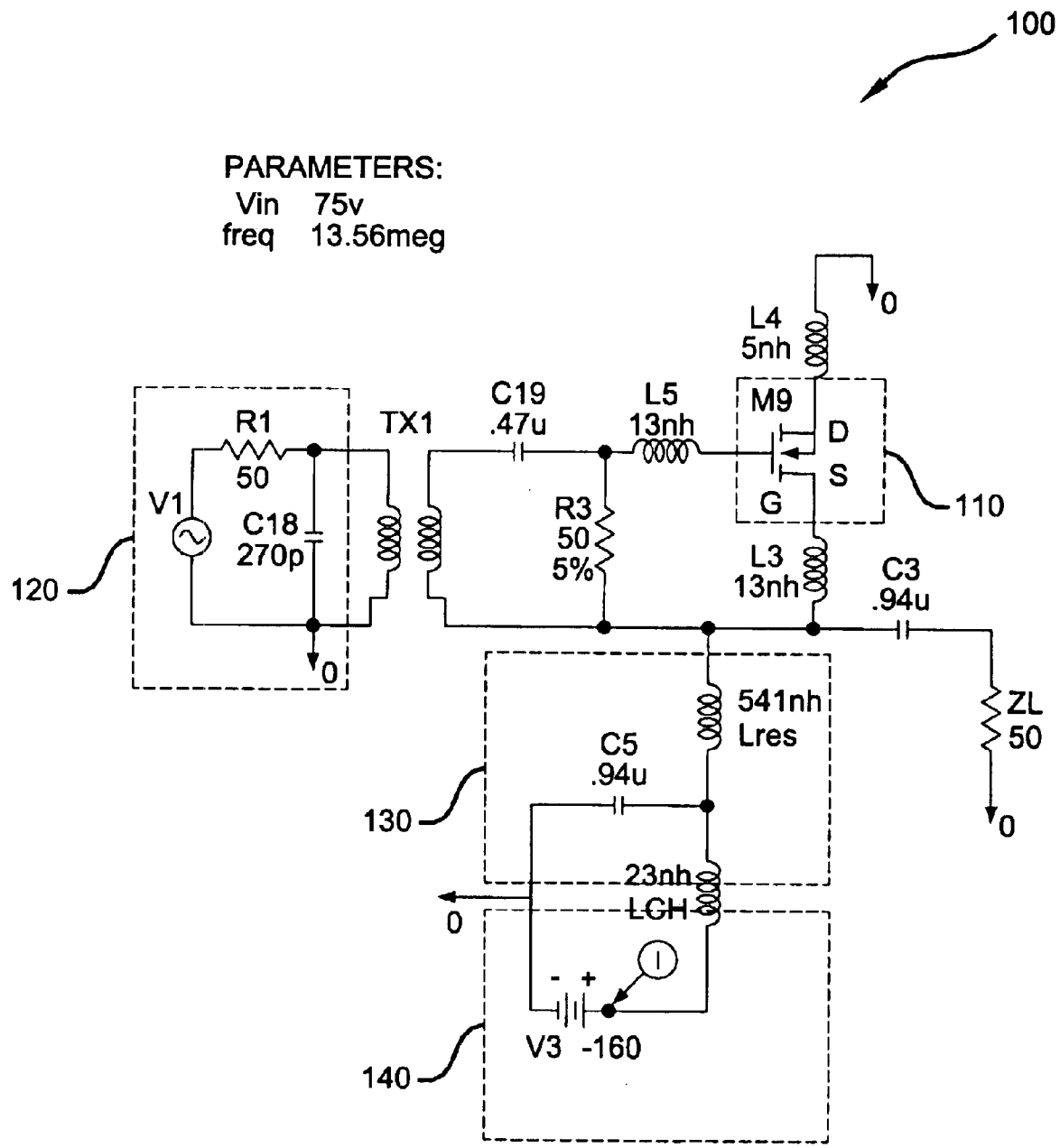
FIG. 1 is a schematic diagram of a switch mode amplifier in accordance with the principles of the present invention.

The RF amplifier of the present invention utilizes a novel circuit configuration that allows the drain or collector terminal of the power transistor to be at ground potential. Therefore, there is no need for an electrical insulator between the transistor and the heatsink. However, even with the drain grounded, the amplifier of the present invention functions similarly to switch mode amplifiers assuring that the amplifier functions both thermally and electrically efficiently. The switch mode amplifiers allow for increased power density and increased ability to drive mismatched RF power loads (also known as high voltage standing wave ratio ("VSWR")). Additionally, if a means for tuning the switch mode resonant circuit can be provided, the amplifier can function over a wider load and frequency range.

The circuit of the present invention differs from existing class E RF amplifiers because of the grounded drain configuration. This results in better heat transfer from the transistors to the heatsink. The circuit of the present invention exhibits high efficiency at normal load and frequency settings yet giving the RF amplifier adequate thermal margin to operate at high VSWR or at frequencies up to 5% to 10% above and below the designed operating frequency. Advantageously, the circuit of the present invention allows the grounded drain circuit to operate in an increased safe operating area which consequently increases the output power capability for a given silicon area and increases power density.

A further advantage of the present invention is the means of driving the amplifier. Generally, a rectangular shaped wave is used to drive the power transistor of the amplifier in the switch mode operation. A quasi-sine wave rather than a square or rectangular wave is used to drive the power transistors in a switch mode operation. Prior art RF power amplifiers generally drove the amplifier with a square or rectangular wave. However, especially at high frequency input signals, a rectangular or square wave is difficult to generate because of the high bandwidth requirements placed on the driver circuitry, including the active devices, the transformers and the interconnects. Utilizing a quasi-sine wave driving circuitry for the input voltage is more practical for a high speed driver circuit to the low input impedance of a power amplifier. Quasi-sine wave driving circuitry at a preset frequency with plus or minus 5% to 10% bandwidth can be accomplished using conventional RF transformer based matching circuits with some degree of compensation for leakage inductances.

A further advantage of the present invention is a stable RF switched power amplifier which can operate on a multitude of load VSWRs over the entire dynamic power and frequency range. As previously mentioned, switched power amplifiers typically exhibit high DC to RF efficiency and are suitable for many applications. By keeping the input drive power fixed, controlling the output power level through a DC supply voltage and deleting RF feedback on the power transistor, high DC to RF efficiency can be achieved over a wide output power range. Stable performance of the amplifier block can be achieved by source degeneration of low frequency energy, selective source degeneration of sub-harmonic energy, absorption of harmonic energy and controlled impedance of all other out-of-band signals.

A further advantage of the present invention is more readily apparent when the RF amplifier of the present invention is integrated into an RF generator for use in a plasma chamber system. Source degeneration of low frequency energy results in the proper control of harmonic ground currents. The present invention aids in improved tracking between the power set point and the actual power delivered from the pasma chamber system. Furthermore, plasma stablization is improved and plasma drop-out occurences are minimized.

Referring now to FIG. 1, there is shown a schematic diagram of a high efficiency RF amplifier in accordance with the principles of the present invention and configured for switched operation. The amplifier 100 includes a power transistor 110 which is a metal-oxide-silicon field effect transistor ("MOSFET") type transistor with the drain terminal tied to ground potential. In one embodiment, the power transistor 110 is implemented as a single discrete MOSFET transistor. It will be understood that the power transistor 110 may be any three terminal semiconductor device where one of the terminals controls the conductance or voltage across the other two terminals. It will be further understood that the power transistor 110 may also be implemented as a single chip or a single die MOSFET transistor. In an alternative embodiment, the power transistor 110 is implemented as a multiple die kilowatt power transistor ("KPT"). It will also be understood that the power transistor 110 may be implemented as an insulated gate bipolar transistor ("IGBT"). It will also be understood that the power transistor 110 may be implemented as a bipolar transistor with the collector terminal tied to ground potential. The output voltage is taken from the source terminal of the transistor 110. The output load is represented by an impedance ZL which is coupled to a DC blocking capacitor C3. The lead inductances in the package are modeled as L3, L4, and L5.

A RF source 120 includes a RF waveform source V1 coupled to a transformer TX1. An input impedance and input capacitance related to the waveform source is modeled by R1. C18 is the input capacitance to match the input impedance by tuning the leakage inductance. The RF source 120 is coupled to the gate terminal of the power transistor 110 through the transformer TX1. The transformer TX1 has one end of the secondary winding coupled to the gate terminal of transistor 110 through a DC blocking capacitor C19 and its other end coupled to the source terminal of the transistor. The transformer TX1 acts as an isolation transformer whose primary winding is connected to the RF source with respect to ground. The secondary winding provides floating output to drive the MOSFET gate terminal with respect to the source terminal.

In a preferred embodiment, the RF source 120 is stable into all VSWR loads over the entire dynamic range of frequencies. The power source may include a low voltage MOSFET device operating in a switch mode employing broadband RF feedback from the drain terminal to the gate terminal and baseband frequency drain degeneration. In a preferred embodiment, the waveform signal from the RF source 120 does not contain excessive harmonic energy. Specifically, the harmonic energy should be prevented from entering directly to the gate terminals of the power transistor 110 and entering indirectly to the gate terminals of the power transistor 110 via harmonic ground currents. Excessive harmonics energy can superimpose on the predetermined frequency band and may cause inconsistency in the effective RF gain and RF output power efficiency for a given supply voltage. In the exemplary embodiment of FIG. 1, the nominal output power level from the RF source 120 is 20 watts.

A resonator circuit 130 is coupled to the source terminal of transistor 110. The resonator circuit includes an inductor Lres and RF bypass capacitor C5. A B+ feed circuit 140 includes a choke inductor LCH and DC voltage source V3 (−160 volts). The resonator circuit 130 resonates the output capacitance of the power transistor 110 when the transistor is in an off state and provides lower controlled impedance when the transistor is in an on state. That is, the transistor sees a fluctuating impedance between the on and off states.

The operation of the above described amplifier is illustrated herein for an RF source with a predetermined frequency band centered around 13.56 MHz. A sinusoidal signal is generated at the RF source 120. As previously mentioned, the RF source 120 may be a sinusoidal wave (which is more easily generated than a square or rectangular wave, especially at high frequencies). The voltage is transferred via the transformer TX1 (2:1 turn ratio) to the input circuit (gate-source) of the power transistor 110. The voltage drop across the resistor-capacitor network formed by resistor R3 and DC blocking capacitor C19 transfers the input voltage to the gate terminal of the transistor 110 without any loss in voltage. When the voltage on the gate of the transistor 110 passes a threshold voltage, the transistor 110 turns on and conducts current through the drain and the source terminals of the transistor. As described above, the drain terminal of the transistor 110 is tied to ground potential. The source terminal of the transistor is tied to the output (or the resistive load network of ZL). The output signal from the amplifier of the present invention is a quasi-sinusoid switch signal which tracks the input voltage at an amplified level. The output signal waveform behaves like a switch when the transistor is on and behaves like a quasi-sinusoid when the transistor is off.

It will be understood that although a field effect transistor is illustrated in the figure, the amplifier of the present invention can be implemented using an IGBT or a bipolar transistor. It will be apparent to one skilled in the art to tie the collector terminal of the bipolar transistor to ground potential.

In a preferred embodiment, the switch mode RF amplifier is used for driving a RF wave at a preset frequency with plus or minus 5% bandwidth furnished along a conduit to a plasma chamber. Typical values for such an application of the amplifier include a sinusoidal RF source at 20 Watts with a predetermined operating frequency of 13.56 MHz. The load is modeled as an output impedance ZL of 50 ohms and a DC blocking capacitor C3 of 0.94 $\mu$F. Similarly, the input impedance R1 is 50 ohms and C18 is 270 pF. The values for the DC blocking capacitor C19 is 0.47 $\mu$F and resistor R3 is 50 ohms. The lead inductances at the terminals of the transistor are modeled as L3 at the source terminal 13$nh$, L4 at the drain terminal 5$nh$, L5 at the gate terminal 13$nh$. The resonator circuit 130 is coupled to a DC voltage source V3 of −160 volts coupled in series with a choke inductor LCH of 23 $\mu$h.

Figure 2A:
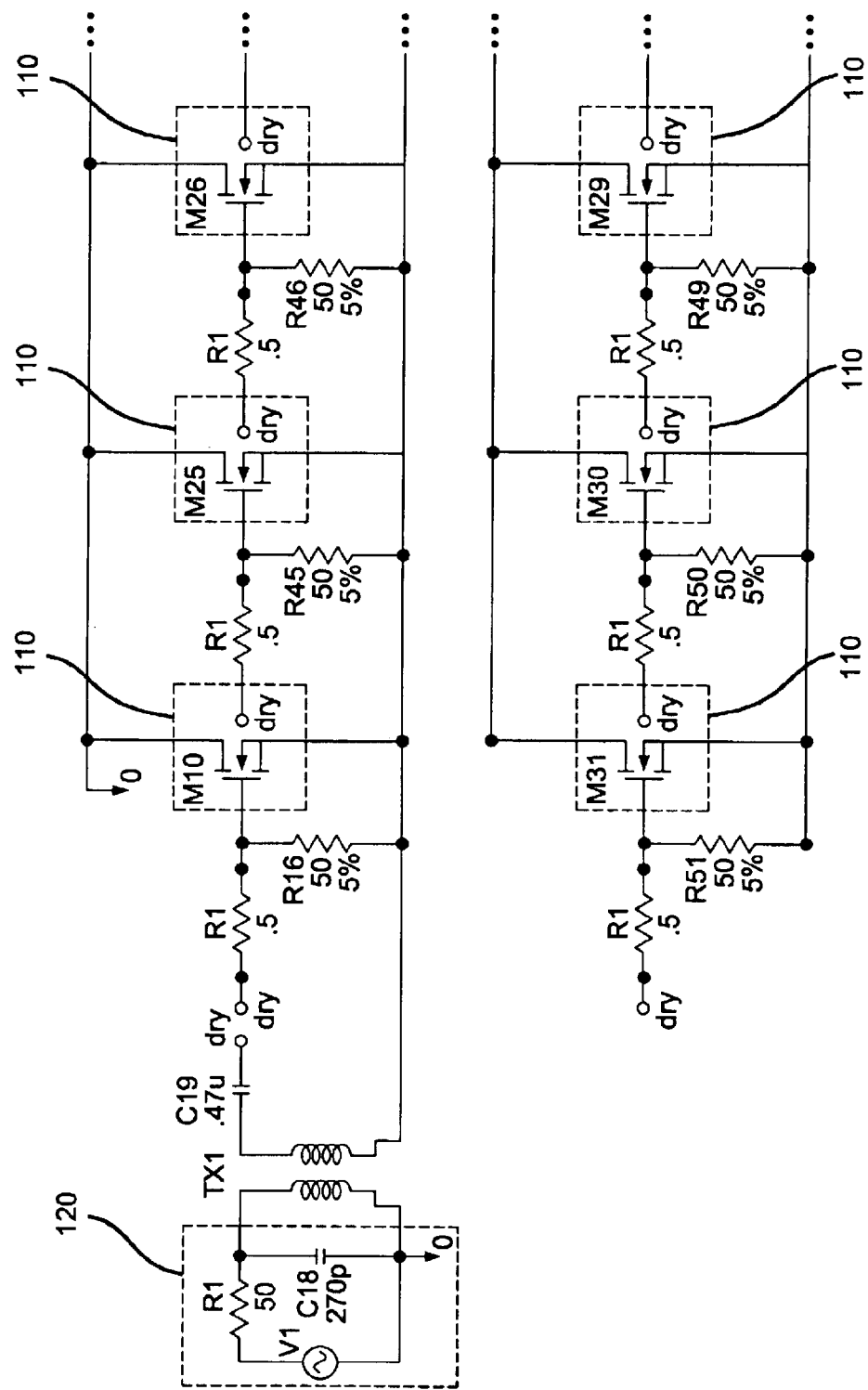
FIG. 2 is a schematic diagram of a switch mode amplifier of the present invention implemented in parallel single input source configuration.
Figure 2B:
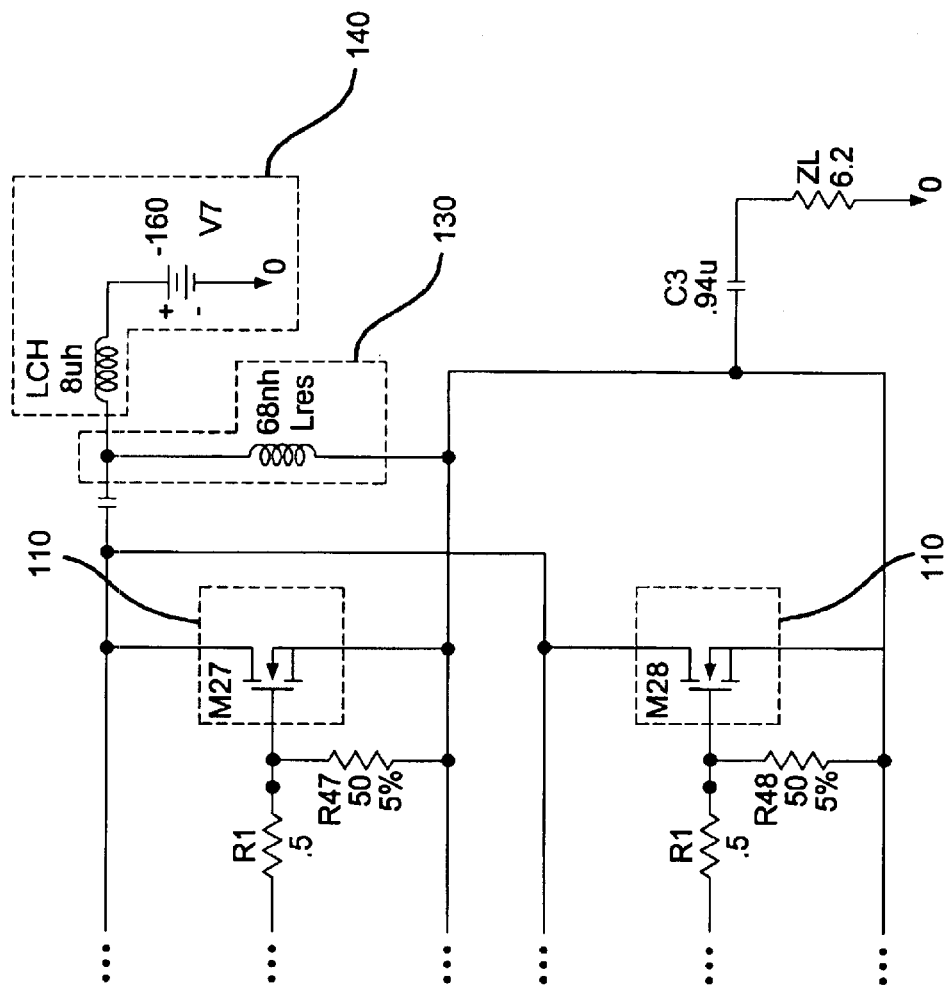

Referring to FIG. 2, there is shown a schematic diagram of the amplifier of the present invention implemented in a parallel configuration. Similar elements to those in FIG. 1 are identified with the same reference characters. The parallel configuration is typically required for high power output with multiple high voltage transistors. In this case, the parallel configuration is required to provide an exemplary power output of 3.6 kW at an operating frequency of 13.56 MHz plus or minus 5%.

Analogous to FIG. 1, a RF source 120 is coupled to a transformer TX1 for driving the gate terminals of eight discrete transistors 110 configured in a grounded drain configuration. A resonator circuit 130 is used to resonate the total output capacitance of eight discrete transistors when the transistors are in an off state. The output load impedance ZL of the combined switch is 5.56 ohms which can be transformed to a standard 50 ohms via a 1:3 turn ratio transformer.

While the arrangement of the above-described embodiment has been described in conjunction with an RF waveform frequency of 13.56 MHz, the invention can be used over a wide range of frequencies, including other RF frequencies such as 27.12 MHz and 40.68 MHz. The other frequencies are multiples of the base RF frequencies. It will be apparent to one skilled in the art to modify the invention to produce other RF frequencies than the ones explicitly mentioned.

Figure 3:
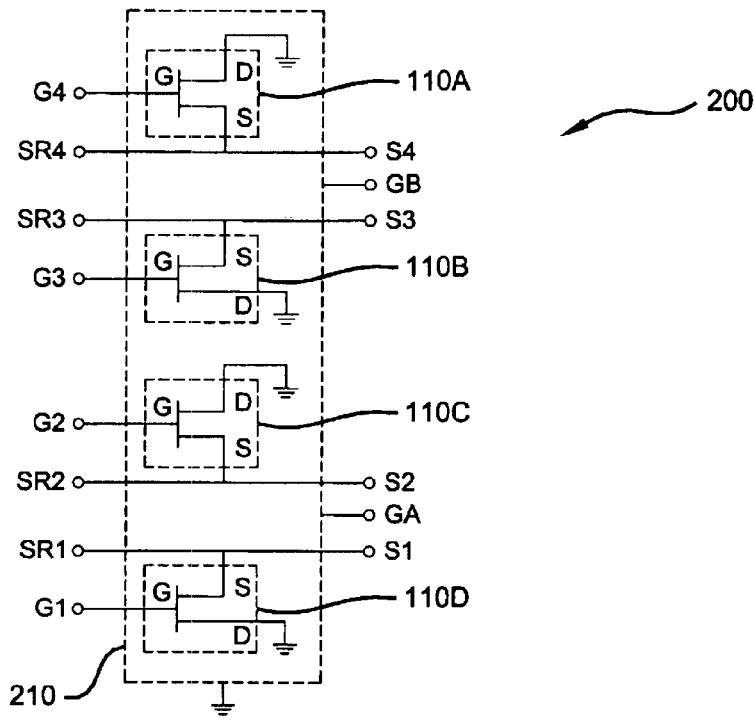
FIG. 3 is a schematic diagram of a prior art cross section view of a four chip kilowatt power transistor in a grounded drain configuration.
Figure 4:
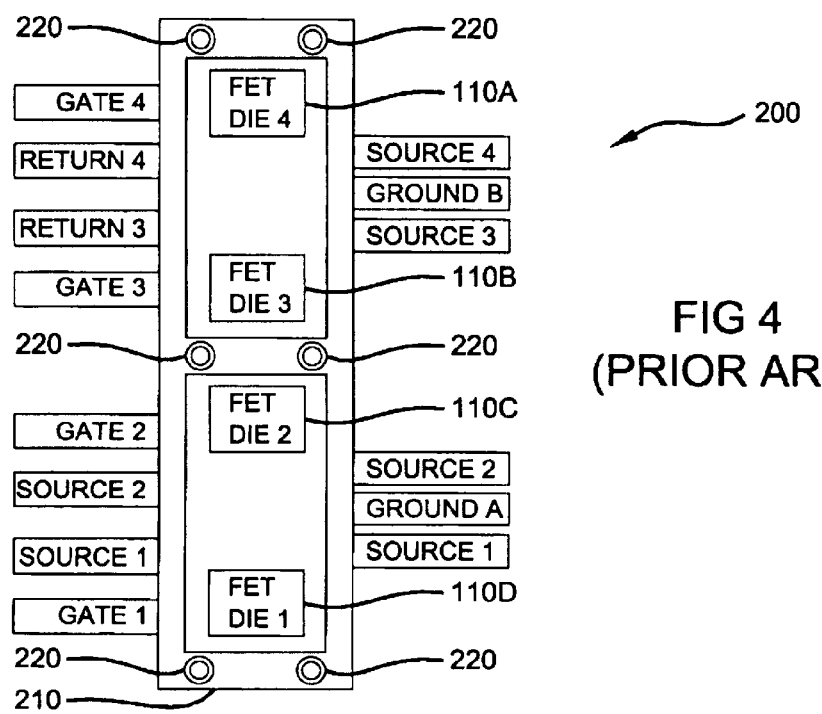
FIG. 4 is a schematic diagram of a prior art plan view of a four chip kilowatt power transistor corresponding to FIG. 3.

In an exemplary embodiment of the present invention, described herein is a RF amplifier block in accordance with the principles of the present invention in use with a kilowatt power transistors ("KPT") arranged in a grounded drain configuration. The KPT and several variations thereof are described in greater detail in U.S. Pat. No. 6,020,636, entitled "Kilowatt Power Transistor," issued on Feb. 1, 2000, which is incorporated by reference herein. With reference to FIGS. 3 and 4, a KPT 200 has a flat metal flange 210 or base, which mounts on a suitable heat sink (not shown) that can be formed as part of the chassis of an amplifier. The KPT is a four chip array design, with four transistor chips or dies 110a, 110b, 110c, 110d mounted on the flange 210, and with their respective drain regions D grounded to the flange 210. Each transistor die has a respective gate G and a respective source S. The sources are coupled to source return leads SR1 to SR4, as shown. The flange 210 is provided with holes 220 for mounting the flange to the corresponding heat sink. A plastic, ceramic, or metal case (not shown) provides protective cover for the four dies. Additionally, the flange 210 itself serves as the grounded drain lead or electrode for each of the four dies.

Figure 5:
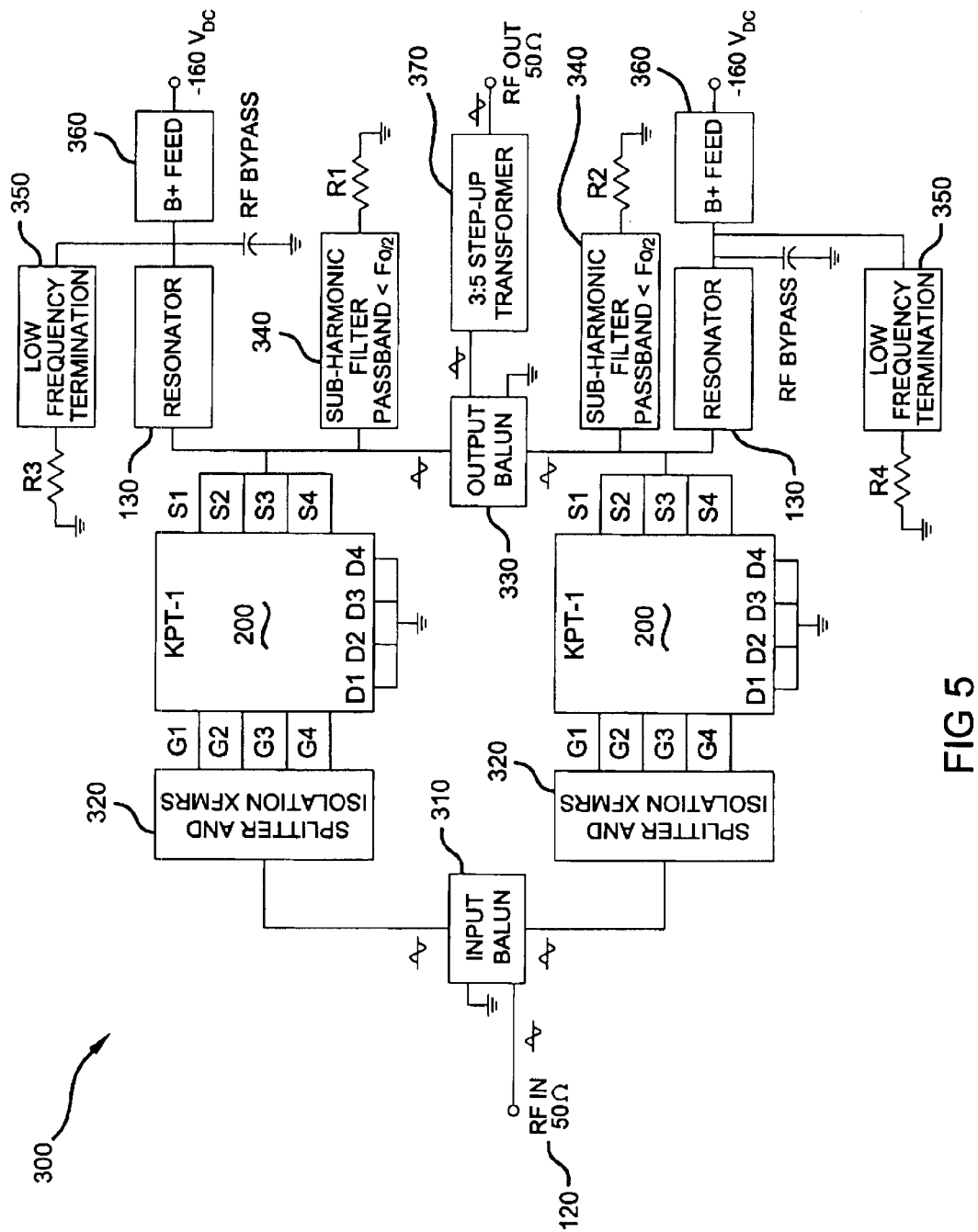
FIG. 5 is a schematic circuit diagram of a RF power amplifier block utilizing the kilowatt power transistor of FIGS. 3 and 4 in a grounded drain configuration in accordance with the principles of the invention.

Referring to FIG. 5, there is shown a schematic diagram of a RF power amplifier block 300 utilizing the KPTs 200 arranged in the grounded drain configuration just described. Two KPTs 200 are arranged in push-pull switched mode to form a stable RF power amplifier for operating into all load VSWRs over the entire designed dynamic range. The RF source 120 is coupled to an input balun 310 for splitting the input power into equal and 180 degrees out of phase signals of the RF source. Splitters 320 are coupled to the input balun 310 for 4-way in-phase splitting of the RF source signal for coupling to the KPTs 200. The splitters 320 additionally include isolation transformers to form individual gate terminal inputs for impedance matching and to provide DC isolation. As mentioned previously, the dies or transistors on the KPT have their drain terminals D1, D2, D3, D4 grounded to the flange. The RF signals are coupled to the gate terminals G1, G2, G3, G4 of the KPTs 200. The source terminals S1, S2, S3, S4 are coupled to an output balun 330 for combining two 180 degrees out of phase signals. The source terminals are additionally coupled through a resonator 130 coupled to a DC voltage source.

Each KPT 200 has a output source terminals S1, S2, S3, S4 which are combined at each input of the output balun transformer 330. The output balun (18 ohms impedance) is coupled to a step-up transformer 370 (3:5 turn ratio) which matches the impedance to the load impedance of 50 ohms. The output balun combines the equal and 180 degrees out of phase output signals for the two KPTs. The resonator 130 is additionally coupled to the output terminals (sources) of the KPT 200 to resonate the capacitance from source terminals S1, S2, S3, S4 to ground potential when the transistors are off. The resonator 130 is additionally coupled to a low frequency termination 350 to terminate and to selectively provide source degeneration of low frequency components for each of the KPTs 200. The low frequency termination 350 dissipates nonharmonic related low frequency spurious signals without affecting the operating frequency band. A sub-harmonic lowpass filter 340 is additionally coupled to the sources if each KPT 200 to selectively degenerate any sub-harmonic components of the operating frequencies. The sub-harmonic lowpass filter and the low frequency termination are discussed in more detail below. There are other ancillary and peripheral elements, such as power supplies, controls and sensors, which are included in this RF generator system, but are outside the scope of this invention.

The parameters to produce a power amplifier designed at 13.56 MHz plus or minus 5% output at 3.6 kW power level with approximately 85% DC to RF efficiency are illustrated in FIG. 5. The RF amplifier block just illustrated is an improvement over the existing RF amplifier by operating the amplifier as a switch and controlling the output level by varying the DC supply voltage. The drain to gate feedback is additionally eliminated and therefore providing for high efficiency. Additionally, the input series gate resistance is eliminated by the addition of a 2-way splitter which operates in-phase for improved MOSFET die isolation. Additionally, the invention features a sensitive resistive source degeneration for low frequencies with the addition of low frequency termination coupled at the resonator. Additionally selective resistive source degeneration for sub-harmonics of the operating frequency are provided by the sub-harmonic low-pass filter. This low-pass filter is a 5th order, 0.1 dB passband ripple, 7.83 MHz cutoff frequency, 8.9 MHz 3 dB bandwidth and −22 dB minimum rejection at 12.2 MHz.

Figure 6A:
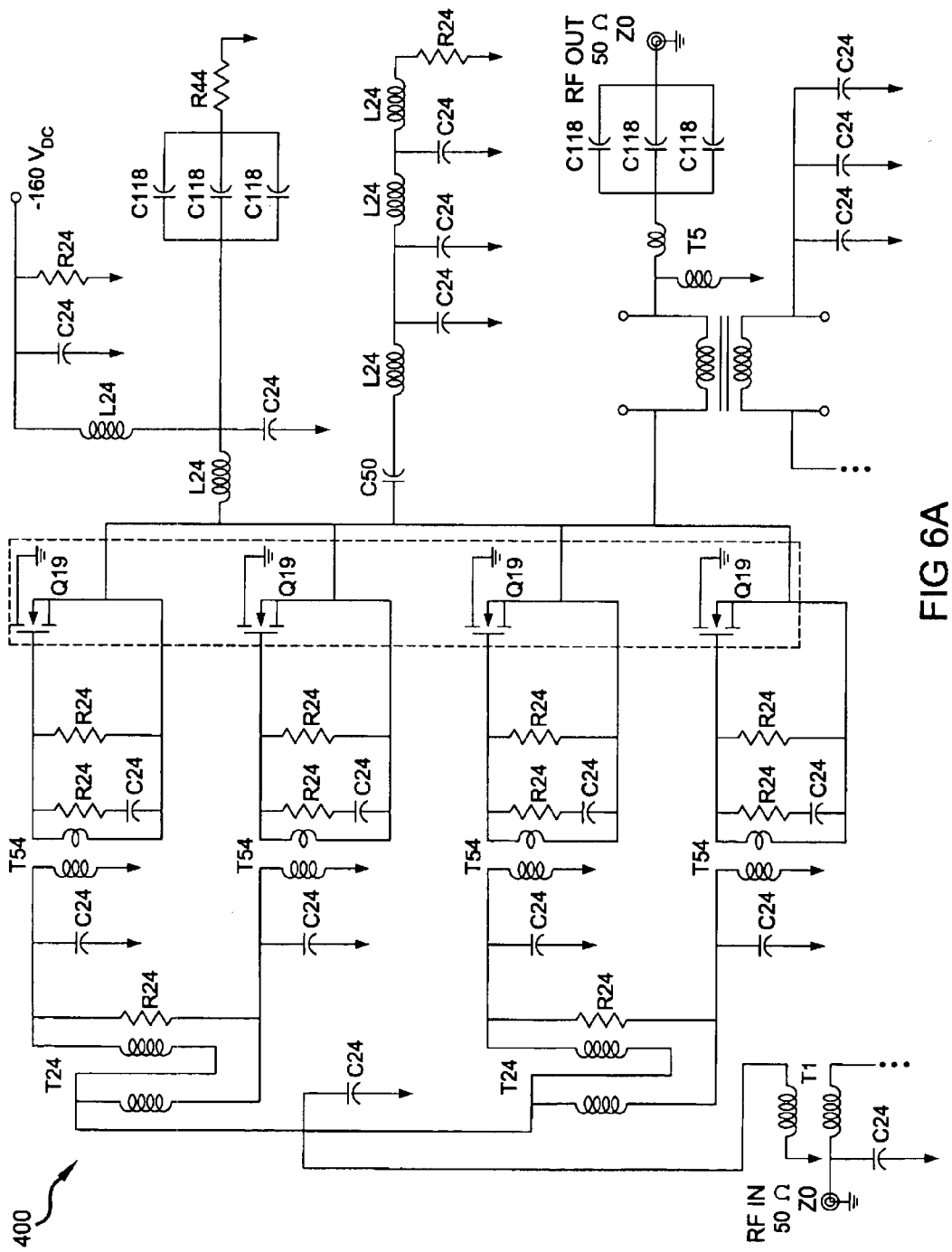
FIG. 6 is a schematic circuit diagram of a RF power amplifier block in a grounded drain configuration in accordance with the principles of the present invention.
Figure 6B:
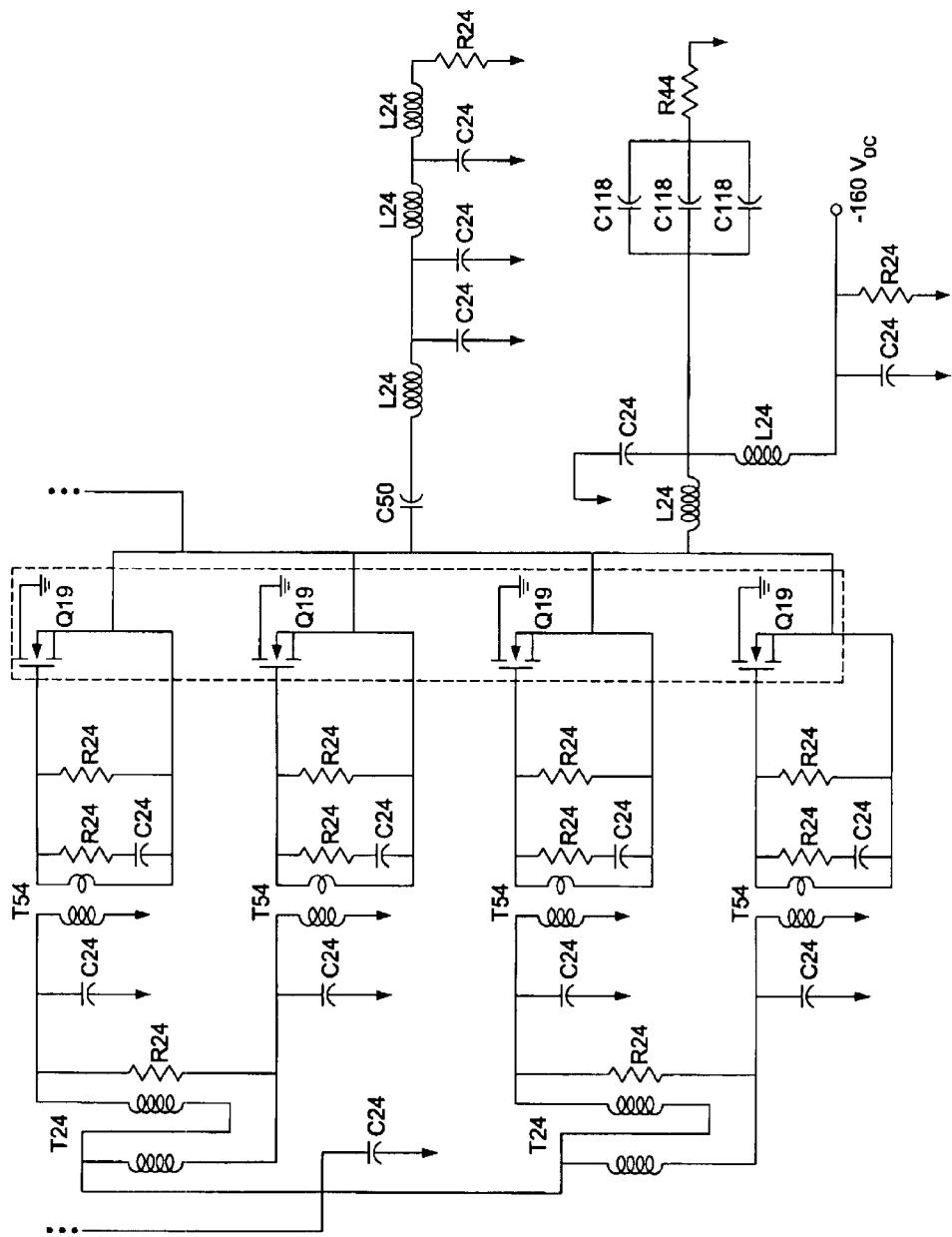

Referring now to FIG. 6, there is shown a circuit level schematic diagram of the RF amplifier block. The circuit diagrams of the die (transistors) of the KPT are shown as part of KPTs 200. Each KPT includes four high voltage transistors whose drain terminals are coupled directly to ground potential via the flange. Each gate terminal and source terminal at the input side have separate driving circuitry so as to achieve RF drive isolation for each MOSFET die for improved die temperature tracking.

In a preferred embodiment, the high voltage, high power MOSFET KPTs 200 as configured for the present invention may have the following characteristics. The drain-source breakdown voltage $V_{DSS}$ may be 1000 volts maximum. The continuous drain current $I_D$ may be 11 amps maximum. The maximum gate to source voltage $V_{GS}$ is approximately plus or minus 30 volts. The gate threshold voltage $V_{G-th}$ is approximately 2 to 4 volts. The forward transconductance $G_{FS}$ is approximately 7 to 11 Siemens. The drain-source on-state resistance $R_{DS-ON}$ is 1 ohm maximum. The junction-case thermal resistance $R_{JC}$ is 0.4 degrees C/watt maximum. The input capacitance $C_{ISS}$ is 2460 pf (typical). The output capacitance $C_{OSS}$ is 360 pf (typical). The reverse transfer capacitance $C_{RSS}$ is 105 pf (typical). The total gate charge $Q_g$ is 90 nC (typical) and the gate-source charge $Q_{gs}$ is 10 nC (typical) and the gate-drain charge $Q_{gd}$ is 50 nC (typical).

The gate-source threshold voltage balance between the four dies of the KPT should be within about 0.2 volts for die-to-die uniformity. This results in all four dies turning on at approximately the same time which is an important criterion in the parallel arrangement described. The drain-source on-resistance balance as among the four dies of the KPT should be within about 8% for even loading and drain efficiency tracking for each MOSFET die. Forward transconductance balance among the four dies of the KPT should be within 1 Siemens for even current draw for each die in a given KPT. For efficient performance at favorable RF power gain, the DC characteristics of the four dies of each KPT should be matched, at the die level. The RF performance should be checked and measured at the KPT level. The RF gain balance among the four dies of a given KPT should be within 0.5 dB. The drain efficiency balance between the four dies of a given KPT should be within 1%.

The matching of these three DC parameters is best achieved using die mapping during the KPT fabrication process. The four dies for the KPT should be selected from the same wafer, and from adjacent locations on the wafer. The DC characteristics such as gate-source threshold voltage and drain-source on-resistance, along with the RF gain and drain efficiency, should ideally be measured for each die at the KPT level.

The input drive circuits for each die are identical, consisting of the following functionalities, namely, input transformer, DC termination or pull-up. Each MOSFET die has a separate input transformer, with an input impedance of 100 ohms. The input wave at the primary of the transformer is with respect to ground, and the output wave at the secondary is with respect to source (or signal output level). The output impedance of this transformer with respect to source is about 6.25 ohms. This transformer is a ferrite loaded ($\mu$=125, high Q, low loss) design, with a primary to secondary turn ratio of 4:1.

Figure 7:
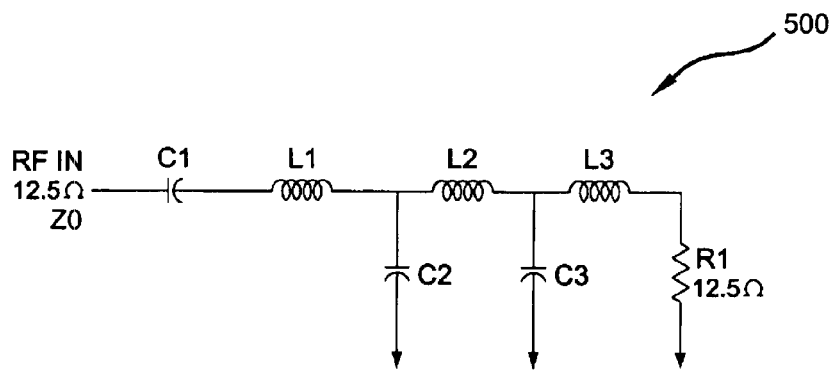
FIG. 7 is a schematic diagram of a sub-harmonic termination low pass filter arranged in an inductor input configuration in accordance with the principles of the present invention.
Figure 8:
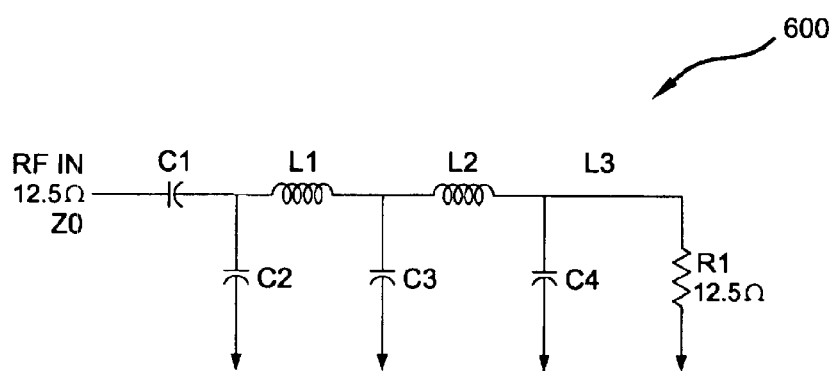
FIG. 8 is a schematic diagram of a sub-harmonic termination low pass filter in a capacitor input configuration in accordance with the principles of the present invention.

Referring to FIGS. 7 and 8, there are shown exemplary embodiments of sub-harmonic termination low pass filters. FIG. 7 shows a series inductor input topology which is compatible with a resonator circuit (Lres) of FIG. 6. The lowpass filter is comprised of capacitor $C_1$ functioning as a DC block capacitor. Three separate inductors $L_1$, $L_2$, $L_3$ function as series inductors and capacitors $C_2$, $C_3$ function as shunt capacitances. The sub-harmonic low pass filter serves to filter out sub-harmonic frequencies of the operating frequency band. In an exemplary embodiment, the low pass filter has 12.5 ohms characteristic impedance. It functions as a 5th order 0.1 dB passband ripple Chebyshev filter design.

Referring to FIG. 8, there is shown a sub-harmonic termination low pass filter arranged in a capacitor input topology. The low pass filter is comprised of three shunt capacitors $C_2$, $C_3$, $C_4$ and two series inductors $L_1$, $L_2$. The capacitor $C_1$ is a DC block capacitor and these elements effectively filter out sub-harmonic frequencies of the operating frequency band. The filter has a 12.5 ohm characteristic impedance. The filter is a 5th order, 0.1 dB passband ripple Chebyshev design.

Figure 9:
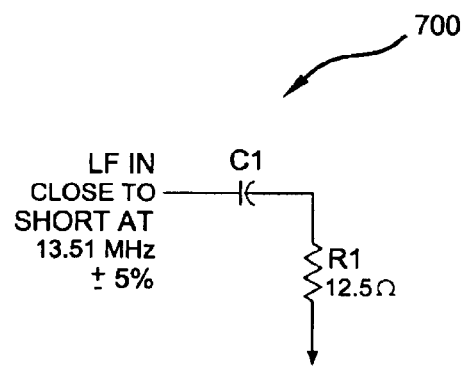
FIG. 9 is a schematic diagram of a low frequency termination for the kilowatt power transistor.

Referring to FIG. 9, there is shown a low frequency termination comprised of a capacitor $C_1$ in series with a resistor $R_1$. Appropriate values for these elements filters out and terminates low frequencies. In a preferred embodiment, the appropriate values for these elements are as follows: $C_1$ is 3 $\mu$F and $R_1$ is 12.5 ohms.

Figure 10:
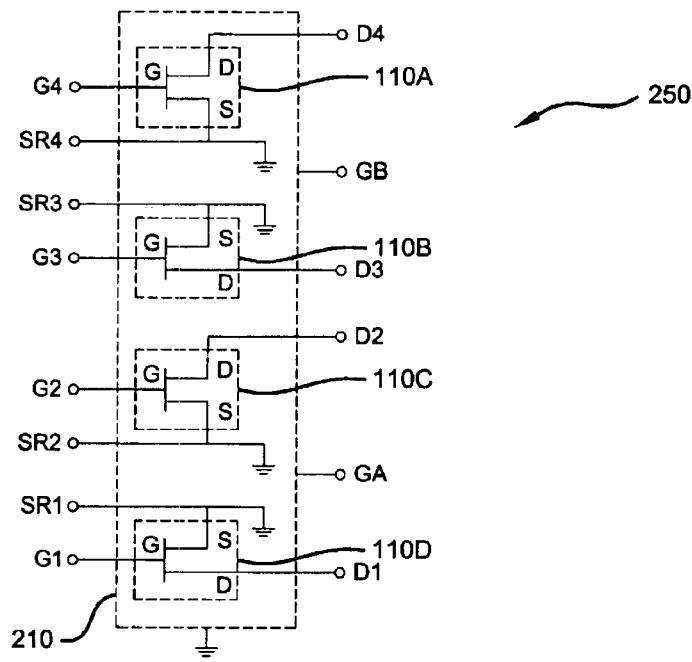
FIG. 10 is a schematic diagram of a prior art cross section view of a four chip kilowatt power transistor in a grounded source configuration.
Figure 11:
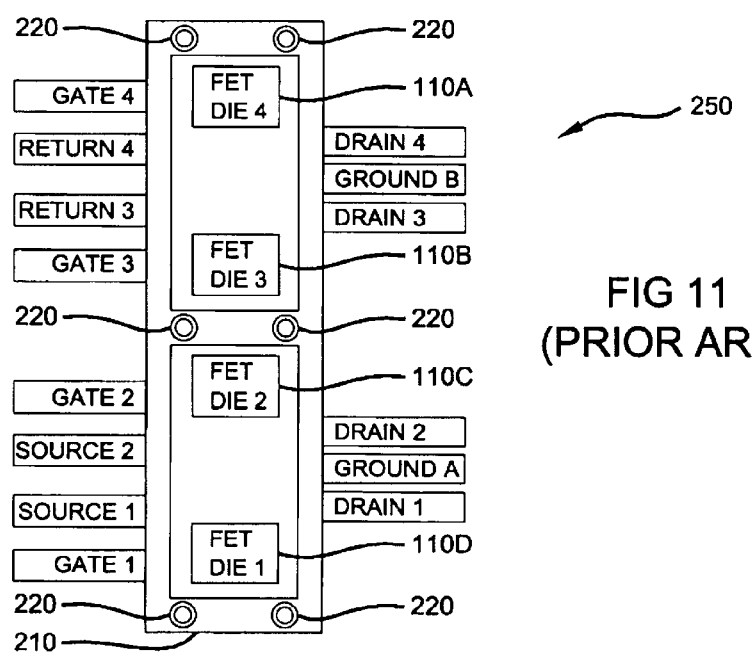
FIG. 11 is a schematic diagram of a prior art plan view of a four chip kilowatt power transistor corresponding to FIG. 10.

Referring to FIGS. 10 and 11, there is shown an alternative embodiment of the kilowatt power transistor 250 of the present invention. In this configuration, the source S terminal of the individual transistors 110 are coupled to ground potential rather than the drain D terminals. The drain terminals D1, D2, D3, D4 are electrically insulated and thermally coupled to the flat metal flange. Analogous to FIGS. 3 and 4, the KPT 250 has a flat metal flange 210 or base, which mounts on a suitable heat sink (not shown) that can be formed as part of the chassis of an amplifier. The KPT is a four chip array design, with four transistor chips or dies 110a, 110b, 110c, 110d mounted on the flange 210, and with their respective source regions S grounded to the flange 210. Each transistor die has a respective gate G and a respective drain D. The flange 210 is provided with holes 220 for mounting the flange to the corresponding heat sink. A plastic, ceramic, or metal case (not shown) provides protective cover for the four dies. Additionally, the flange 210 itself serves as the grounded source lead for each of the four dies.

Figure 12:
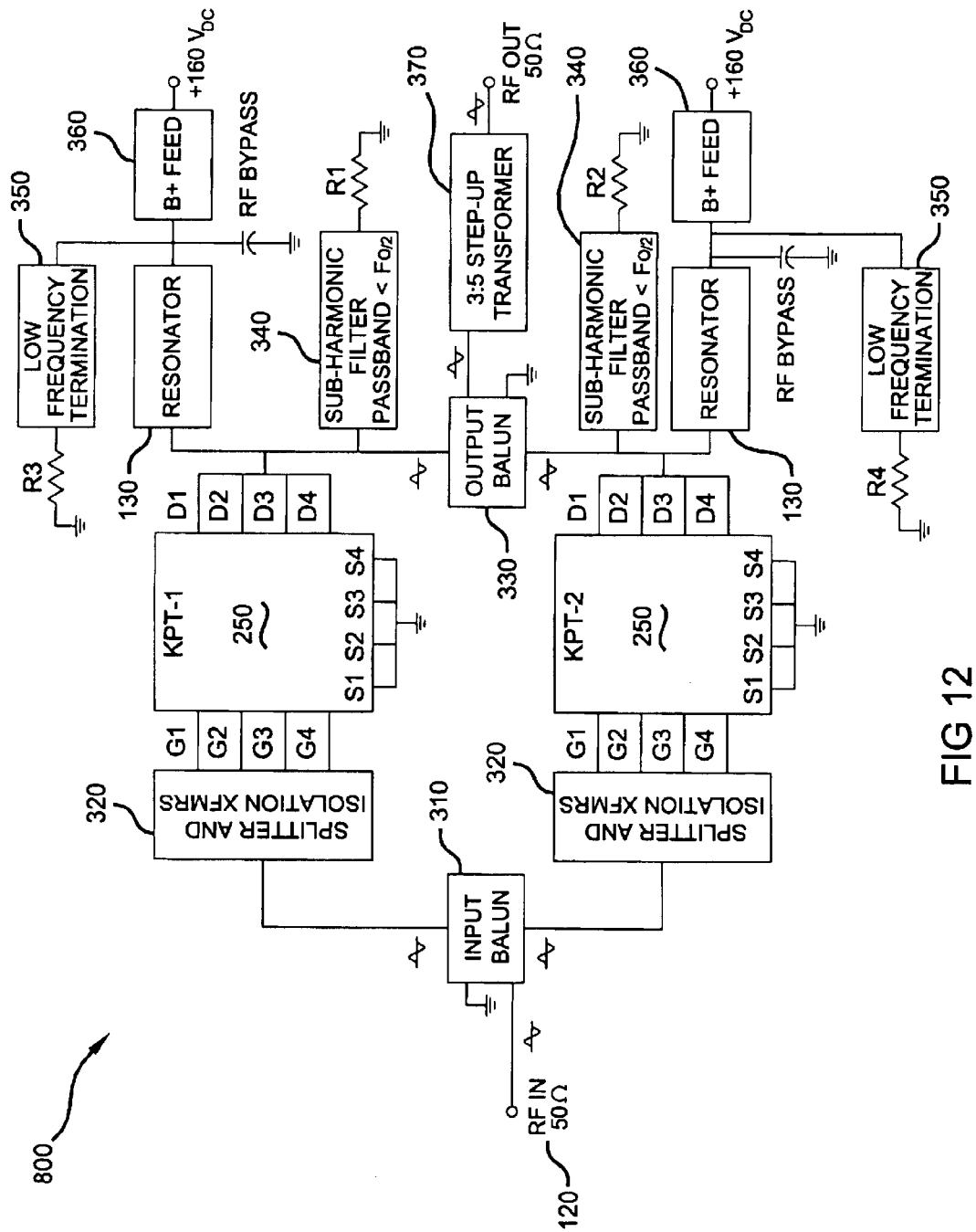
FIG. 12 is a schematic circuit diagram of a RF power amplifier block utilizing the kilowatt power transistor of FIGS. 5 and 6 in a grounded source configuration in accordance with the principles of the invention.

Referring to FIG. 12, there is shown a schematic diagram of a RF power amplifier block 300 utilizing the KPTs 250 arranged in the grounded source configuration just described. Two KPTs 250 are arranged in push-pull switched mode to form a stable RF power amplifier for operating into all load VSWRs over the entire designed dynamic range. The RF source 120 is coupled to an input balun 310 to split the input signal into two equal and 180 degree out of phase signals. Splitters 320 are coupled to the input balun 310 for splitting the signal 4 ways equally and in-phase for coupling to the KPTs 250. The splitters 320 additionally include isolation transformers to form individual gate terminal inputs. As mentioned previously, the dies or transistors on the KPT have their source terminals S1, S2, S3, S4 grounded to the flange. The RF signals are coupled to the gate terminals G1, G2, G3, G4 of the KPTs 250. The drain terminals D1, D2, D3, D4 are coupled to an output balun 330 for combining the two out of phase signals. The drain terminals are additionally coupled through a resonator 130 coupled to a DC voltage source.

The RF amplifier block in a grounded source configuration operates in an analogous way to the grounded drain configuration illustrated in FIG. 5. That is, each KPT 250 has four drain terminals D1, D2, D3, D4 which are directly combined at an output balun transformer 330. The output balun transformer 330 combines the two out of phase signals from each KPT at an impedance of 18 ohms. The output balun is coupled to a step-up transformer 370 which matches the impedance of the output balun with the load impedance of 50 ohms. The resonator 130 is additionally coupled to the drain terminals of the KPT 200 to resonate the capacitance from drain terminals D1, D2, D3, D4 to ground potential when the transistors are off. The resonator 130 is additionally coupled to a low frequency termination 350 to terminate and to selectively provide drain degeneration of low frequency components for each KPT 250. A sub-harmonic lowpass filter 340 is additionally coupled to the drain of each KPT 250 to selectively degenerate any sub-harmonic components of the operating frequencies. The sub-harmonic lowpass filter and the low frequency termination are as discussed previously. There are other ancillary and peripheral elements, such as power supplies, controls and sensors, which are included in this RF generator system, but are outside the scope of this invention.

Figure 13:
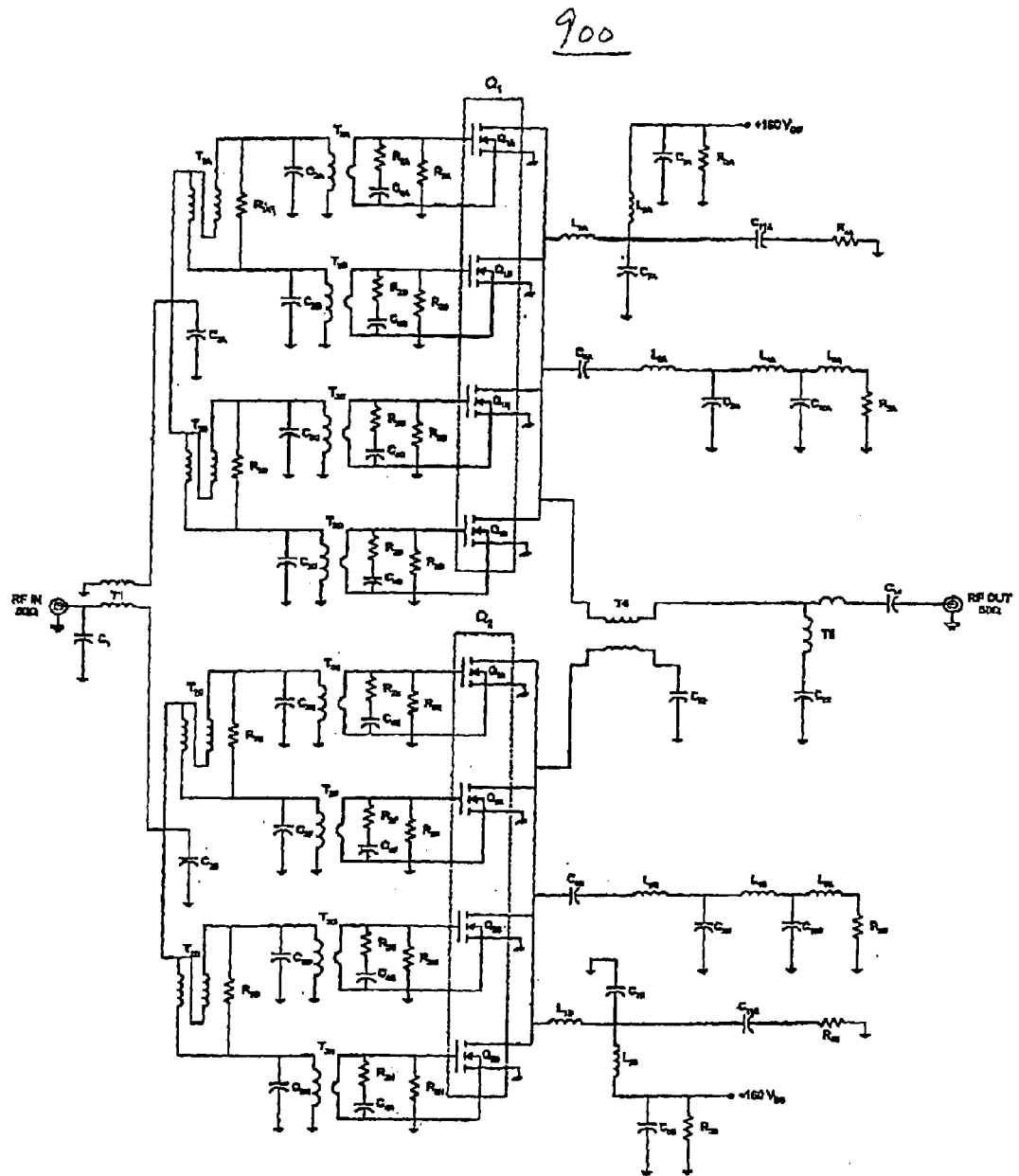
FIG. 13 is a schematic circuit diagram of a RF power amplifier block in a grounded source configuration in accordance with the principles of the present invention.

The parameters to produce a power amplifier designed at 13.56 MHz with plus or minus 5% output at 3.6 kW with approximately 85% DC to RF efficiency are illustrated in FIG. 13.

Although the present invention is described in various illustrative embodiments, it is not intended to limit the invention to the precise embodiments disclosed herein. Accordingly, this description is to be construed as illustrative only. Those who are skilled in this technology can make various alterations and modifications without departing from the scope and spirit of this invention. Therefore, the scope of the present invention shall be defined and protected by the following claims and their equivalents. The exclusive use of all modifications within the scope of the claims is reserved.

What is claimed is:

1. A radio frequency ("RF") power amplifier with high output efficiency operating in a switched mode at a predetermined frequency band, said amplifier comprising:

a semiconductor device having a control terminal and two conducting terminals, said semiconductor device capable of a conductive state and a nonconductive state, wherein said control terminal controls the conductance across said two conducting terminals, wherein a first of said two conducting terminals is tied to ground potential, wherein a second of said two conducting terminals comprises the output of said amplifier;

a RF source coupled to said control terminal of said semiconductor device;

a resonant inductor circuit coupled to said second of said two conducting terminals for eliminating the capacitance between said two conducting terminals when said semiconductor device is in said nonconductive state;

a subharmonic filter coupled to said second of said two conducting terminals, the subharmonic filter having a passband that passes subharmonic frequencies of said predetermined frequency band at said second of said conducting terminals to a termination circuit to reduce said subharmonic frequencies of said predetermined frequency band; and a low frequency termination circuit coupled to said second of said two conducting terminals through said resonant inductor circuit.

2. The RF power amplifier of claim 1 wherein said RF source is a sinusoidal wave.

3. The RF power amplifier of claim 1 wherein said RF source is a rectangular wave.

4. The RF amplifier of claim 1 wherein said RF source is a square wave.

5. The RF power amplifier of claim 1 wherein said semiconductor device is a field effect transistor.

6. The RF amplifier of claim 5 wherein said field effect transistor is a metal oxide silicon field effect transistor.

7. The RF amplifier of claim 1 wherein said semiconductor device is a bipolar transistor.

8. The RF amplifier of claim 7 wherein said bipolar transistor is an insulated gate bipolar transistor.

9. The RF amplifier of claim 1 wherein said semiconductor device is a plurality of discrete transistors arranged in a parallel configuration sharing said RF source.

10. The RF amplifier of claim 9 wherein said plurality of discrete transistors are arranged in a kilowatt power transistor configuration.

11. The RF amplifier of claim 1 wherein said subharmonic filter includes a low pass filter that has said termination circuit for terminating subharmonic signals, said termination circuit coupling said subharmonic filter to ground potential.

12. The RF power amplifier of claim 1 wherein said resonant inductor circuit comprises:

an inductor; and a DC voltage source coupled to said inductor.

13. The RF power amplifier of claim 1 wherein said resonant inductor circuit modifies the load impedance of said semiconductor device in said conductive state.

14. The RF amplifier of claim 1 wherein said low frequency termination circuit provides controlled impedance around said predetermined frequency band.

15. The RF amplifier of claim 14 wherein said RF source is stable into all voltage standing wave ratio ("VSWR") load conditions over the dynamic range of output power.

16. The RF amplifier of claim 1 wherein the output of said RF source is fixed.

17. The RF amplifier of claim 1 wherein the output of said RF source is varied.

18. The RF amplifier of claim 1 wherein the RF amplifier is a class E amplifier without RF broadband feedback.

19. The RF amplifier of claim 1 wherein said low frequency termination circuit includes a low pass filter having a passband that passes spurious low frequency signals and substantially blocks the baseband signal at the fundamental frequency.

20. A radio frequency ("RF") power amplifier with high output efficiency operating in a switched mode at a predetermined frequency band, said amplifier comprising:

a discrete transistor having a gate terminal, a source terminal, and a drain terminal, said drain terminal in a grounded configuration, said source terminal comprising the output of said amplifier;

a RF source coupled to said gate terminal of said discrete transistor;

a resonant inductor circuit coupled to said source terminal for eliminating the capacitance between said drain terminal and said source terminal when said discrete transistor is in an off state;

a subharmonic filter coupled between said source terminal and ground, the subharmonic filter including a low pass filter having a cutoff frequency to pass subharmonic frequencies of said predetermined frequency band at said source terminal to a termination circuit of said subharmonic filter to reduce said subharmonic frequencies of said predetermined frequency band; and a low frequency termination circuit coupled to said source terminal through said resonant inductor circuit.

21. The RF power amplifier of claim 20 wherein said RF source is a sinusoidal wave.

22. The RF power amplifier of claim 20 wherein said RF source is a square wave.

23. The RF power amplifier of claim 20 wherein said RF source is a rectangular wave.

24. The RF power amplifier of claim 20 wherein said resonant inductor circuit comprises:

an inductor; and a DC voltage source coupled to said inductor.

25. The RF amplifier of claim 20 wherein said discrete transistor is a field effect transistor.

26. The RF amplifier of claim 20 wherein said discrete transistor is a metal oxide silicon field effect transistor.

27. The RF amplifier of claim 20 wherein said discrete transistor is a bipolar transistor.

28. The RF amplifier of claim 20 wherein a plurality of said discrete transistors are arranged in a parallel configuration sharing said RF source.

29. The RF amplifier of claim 28 wherein said plurality of said discrete transistors are arranged in a kilowatt power transistor configuration.

30. The RF power amplifier of claim 20 wherein said resonant inductor circuit modifies the load impedance of said discrete transistor in said conductive state.

31. The RF power amplifier of claim 20 wherein said low frequency termination circuit includes a low pass filter having a passband that passes spurious low frequency signals.

32. The RF amplifier of claim 31 wherein said low frequency termination circuit provides controlled impedance around said predetermined frequency band.

33. The RF amplifier of claim 20 wherein the RF amplifier is a class E amplifier without broadband RF feedback.

34. The RF amplifier of claim 20 wherein the termination circuit for terminating subharmonic frequencies is a resistance.

35. A radio frequency ("RF") power amplifier with high output efficiency operating in a switched mode at a predetermined frequency band, said amplifier comprising:

a discrete transistor having a gate terminal, a source terminal, and a drain terminal, said source terminal in a grounded configuration, said drain terminal comprising the output of said amplifier;

a RF source coupled to said gate terminal of said discrete transistor;

a resonant inductor circuit coupled to said drain terminal for eliminating the capacitance between said drain terminal and said source terminal when said discrete transistor is in an off state;

a subharmonic filter coupled to said drain terminal and ground, the subharmonic filter having a passband that passes subharmonic frequencies of said predetermined frequency band at said drain terminal to a termination circuit to reduce said subharmonic frequencies of said predetermined frequency; and a low frequency termination circuit coupled to said drain terminal through said resonant inductor circuit.

36. The RF power amplifier of claim 35 wherein said RF source is a sinusoidal wave.

37. The RF power amplifier of claim 35 wherein said RF source is a square wave.

38. The RF power amplifier of claim 35 wherein said RF source is a rectangular wave.

39. The RF power amplifier of claim 35 wherein said resonant inductor circuit comprises:

an inductor; and a DC voltage source coupled to said inductor.

40. The RF amplifier of claim 35 wherein said discrete transistor is a field effect transistor.

41. The RF amplifier of claim 40 wherein said discrete transistor is a metal oxide silicon field effect transistor.

42. The RF amplifier of claim 35 wherein said discrete transistor is a bipolar transistor.

43. The RF amplifier of claim 35 wherein a plurality of said discrete transistors are arranged in a parallel configuration sharing said RF source.

44. The RF amplifier of claim 43 wherein said plurality of said discrete transistors are arranged in a kilowatt power transistor configuration.

45. The RF power amplifier of claim 35 wherein said resonant inductor circuit modifies the load impedance of said discrete transistor in said conductive state.

46. The RF amplifier of claim 35 wherein said low frequency termination circuit provides controlled impedance around said predetermined frequency band.

47. The RF amplifier of claim 35 wherein said subharmonic filter includes a low pass filter that has said termination circuit for terminating subharmonic signals, said termination circuit coupling said subharmonic filter to ground potential.

48. The RF amplifier of claim 35 wherein said termination circuit for terminating subharmonic signals comprises a resistance.

49. The RF amplifier of claim 35 wherein said subharmonic filter includes a low pass filter that has said termination circuit for terminating subharmonic signals, said termination circuit coupling said subharmonic filter to ground potential.

50. The RF amplifier of claim 49 wherein the termination circuit for terminating subharmonic signals comprises a resistance.

51. The RF amplifier of claim 35 wherein the RF amplifier is a class E amplifier without broadband RF feedback.

52. The RF amplifier of claim 35 wherein said low frequency termination circuit includes a low pass filter having a passband that passes spurious low frequency signals and substantially blocks the baseband signal at the fundamental frequency.

* * * * *

UNITED STATES PATENT AND TRADEMARK OFFICE
CERTIFICATE OF CORRECTION

PATENT NO. : 6,750,711 B2
DATED : June 15, 2004
INVENTOR(S) : Yogendra K. Chawla et al.

It is certified that error appears in the above-identified patent and that said Letters Patent is hereby corrected as shown below:

Column 13,
Line 8, after "frequency" insert -- band --.

Signed and Sealed this

Twenty-second Day of November, 2005

JON W. DUDAS
*Director of the United States Patent and Trademark Office*